US010535600B2

(12) United States Patent
Seo et al.

(10) Patent No.: US 10,535,600 B2
(45) Date of Patent: Jan. 14, 2020

(54) SEMICONDUCTOR DEVICE

(71) Applicant: Samsung Electronics Co., Ltd., Suwon-si (KR)

(72) Inventors: Hoon Seok Seo, Suwon-si (KR); Jong Min Baek, Seoul (KR); Su Hyun Bark, Suwon-si (KR); Sang Hoon Ahn, Hwaseong-si (KR); Hyeok Sang Oh, Suwon-si (KR); Eui Bok Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/987,211

(22) Filed: May 23, 2018

(65) Prior Publication Data

US 2019/0148289 A1  May 16, 2019

(30) Foreign Application Priority Data

Nov. 15, 2017 (KR) .................. 10-2017-0152069

(51) Int. Cl.
*H01L 23/52* (2006.01)
*H01L 23/522* (2006.01)
*H01L 21/768* (2006.01)
*H01L 23/528* (2006.01)
*H01L 29/41* (2006.01)

(52) U.S. Cl.
CPC .... *H01L 23/5226* (2013.01); *H01L 21/76816* (2013.01); *H01L 21/76883* (2013.01); *H01L 23/5283* (2013.01); *H01L 29/41* (2013.01)

(58) Field of Classification Search
CPC ............. H01L 23/5226; H01L 23/5283; H01L 21/76883; H01L 21/528; H01L 29/41
See application file for complete search history.

(56) References Cited

U.S. PATENT DOCUMENTS

| 5,161,093 A | * | 11/1992 | Gorczyca | ............ | H01L 21/4857 257/E23.077 |
| 5,904,556 A | * | 5/1999 | Suzuki | .............. | H01L 21/32051 257/E21.295 |

(Continued)

FOREIGN PATENT DOCUMENTS

KR       10-0790293 A      4/2004

*Primary Examiner* — William Coleman
(74) *Attorney, Agent, or Firm* — Muir Patent Law, PLLC

(57) ABSTRACT

A semiconductor device is provided. The semiconductor device includes a substrate including a lower wiring, a first interlayer insulating film disposed on the substrate and including a first region and a second region over the first region, an etch stop film on the first interlayer insulating film, a second interlayer insulating film on the etch stop film, a first upper wiring in the second interlayer insulating film, the etch stop film, and the second region of the first interlayer insulating film and the first upper wiring is spaced apart from the lower wiring and a via in the first region of the first interlayer insulating film, and the via connects the lower wiring and the first upper wiring, wherein the first upper wiring includes a first portion in the second interlayer insulating film, and a second portion in the etch stop film and the second region of the first interlayer insulating film, and a sidewall of the second portion of the first upper wiring includes a stepwise shape.

19 Claims, 18 Drawing Sheets

(56) References Cited

U.S. PATENT DOCUMENTS

| | | | | |
|---|---|---|---|---|
| 6,037,664 A * | 3/2000 | Zhao | H01L 21/7681 | |
| | | | 257/751 | |
| 6,150,723 A * | 11/2000 | Harper | H01L 21/76807 | |
| | | | 257/751 | |
| 6,303,447 B1 * | 10/2001 | Chhagan | H01L 21/28044 | |
| | | | 257/E21.198 | |
| 6,342,733 B1 * | 1/2002 | Hu | H01L 21/288 | |
| | | | 257/750 | |
| 6,597,032 B1 * | 7/2003 | Lee | H01L 28/55 | |
| | | | 257/296 | |
| 6,768,204 B1 * | 7/2004 | Lukanc | H01L 23/5226 | |
| | | | 257/758 | |
| 6,787,448 B2 * | 9/2004 | Chung | H01L 21/76808 | |
| | | | 257/E21.579 | |
| 6,815,339 B2 | 11/2004 | Choi | | |
| 6,890,852 B2 | 5/2005 | Matsubara | | |
| 7,145,241 B2 * | 12/2006 | Takayama | H01L 21/2855 | |
| | | | 257/758 | |
| 7,148,572 B2 * | 12/2006 | Domae | H01L 21/2855 | |
| | | | 257/758 | |
| 7,311,852 B2 * | 12/2007 | Li | H01L 21/31116 | |
| | | | 216/39 | |
| 7,468,320 B2 | 12/2008 | Hu et al. | | |
| 7,719,115 B2 * | 5/2010 | Seta | G06F 17/5077 | |
| | | | 257/750 | |
| 7,807,567 B2 * | 10/2010 | Kawano | H01L 21/76804 | |
| | | | 257/774 | |
| 8,258,039 B2 * | 9/2012 | Inoue | H01L 27/105 | |
| | | | 257/296 | |
| 8,871,635 B2 * | 10/2014 | Park | H01L 21/76883 | |
| | | | 257/751 | |
| 9,165,883 B2 * | 10/2015 | Vannier | H01L 21/76802 | |
| 9,230,854 B2 * | 1/2016 | Chao | H01L 21/76816 | |
| 9,324,650 B2 | 4/2016 | Edelstein et al. | | |
| 9,536,826 B1 * | 1/2017 | Chang | H01L 23/485 | |
| 9,647,091 B2 * | 5/2017 | Leobandung | H01L 29/66795 | |
| 9,685,406 B1 | 6/2017 | Briggs et al. | | |
| 9,922,994 B2 * | 3/2018 | Hodo | H01L 27/1225 | |
| 10,090,246 B2 * | 10/2018 | Liu | H01L 23/5226 | |
| 2007/0059923 A1 | 3/2007 | Lee et al. | | |
| 2015/0145055 A1 * | 5/2015 | Kim | H01L 21/768 | |
| | | | 257/368 | |
| 2017/0194229 A1 * | 7/2017 | Yi | H01L 23/3192 | |
| 2019/0043804 A1 * | 2/2019 | Qian | H01L 23/5226 | |

\* cited by examiner

SEMICONDUCTOR DEVICE

This application claims priority under 35 U.S.C § 119 to Korean Patent Application No. 10-2017-0152069 filed on Nov. 15, 2017 in the Korean Intellectual Property Office, the disclosure of which is incorporated herein by reference in its entirety.

BACKGROUND

1. Field of the Inventive Concept

The present disclosure relates to a semiconductor device and a method for fabricating the same.

2. Description of the Related Art

As down-scaling of semiconductor devices has rapidly progressed due to development of an electronic technique, high integration and low power consumption of semiconductor chips have been desired. As a result, the intervals between the circuit components such as wirings gradually decrease, and a leakage problem or the like may occur. Further, in order to achieve high integration and low power consumption of the semiconductor chip, an aspect ratio of a wiring layer increases. Various researches are being conducted to form a wiring layer having an increased aspect ratio so as not to contain defects.

SUMMARY

An aspect of the present inventive concept provides a semiconductor device capable of reducing a short circuit phenomenon between an upper wiring and a via.

Another aspect of the present inventive concept provides a method for fabricating a semiconductor device capable of reducing a short circuit phenomenon between an upper wiring and a via.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to some embodiments of the inventive concept, there is provided a semiconductor device comprising, a substrate including a lower wiring, a first interlayer insulating film disposed on the substrate and including a first region and a second region over the first region, an etch stop film on the first interlayer insulating film, a second interlayer insulating film on the etch stop film, a first upper wiring in the second interlayer insulating film, the etch stop film, and the second region of the first interlayer insulating film and the first upper wiring is spaced apart from the lower wiring and a via in the first region of the first interlayer insulating film, and the via connects the lower wiring and the first upper wiring, wherein the first upper wiring includes a first portion in the second interlayer insulating film, and a second portion in the etch stop film and the second region of the first interlayer insulating film, and a sidewall of the second portion of the first upper wiring includes a stepwise shape.

According to some embodiments of the inventive concept, there is provided a semiconductor device comprising a substrate including a lower wiring, a first interlayer insulating film disposed on the substrate and including a first region and a second region over the first region, an etch stop film on the first interlayer insulating film, a second interlayer insulating film on the etch stop film, a via connected to the lower wiring in the first region of the first interlayer insulating film, a trench in the second interlayer insulating film, the etch stop film, and the second region of the first interlayer insulating film and the trench exposes the via and a first upper wiring on the via and connected to the via, and filling the trench, wherein at a boundary between the second region of the first interlayer insulating film and the etch stop film, a first width of the first upper wiring in the second region of the first interlayer insulating film in a first direction parallel to an upper surface of the substrate is smaller than a second width of the first upper wiring in the etch stop film in the first direction.

According to some embodiments of the inventive concept, there is provided a semiconductor device comprising a substrate including a lower wiring, an interlayer insulating film disposed on the substrate and including a first region, a second region on the first region, and a third region on the second region, an opening in the interlayer insulating film, wherein the opening includes a first portion exposing the lower wiring and defined by the first region of the interlayer insulating film, a second portion defined by the second region of the interlayer insulating film, and a third portion defined by the third region of the interlayer insulating film, wherein the third portion of the opening is elongated to form horizontal wiring; a via which fills the first portion of the opening and connected to the lower wiring on the lower wiring; and a first upper wiring on the via, wherein the first upper wiring fills the second portion of the opening and the third portion of the opening, connects to the via, and includes a short side extending in a first direction parallel to an upper surface of the substrate, wherein at a boundary between the second region of the interlayer insulating film and the third region of the interlayer insulating film, a first width of the first upper wiring filling the second portion of the opening in the first direction is smaller than a second width of the first upper wiring filling the third portion of the opening in the first direction.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, a semiconductor device according to some embodiments of the present inventive concept will be described with reference to FIGS. 1 to 4.

Figure 1:
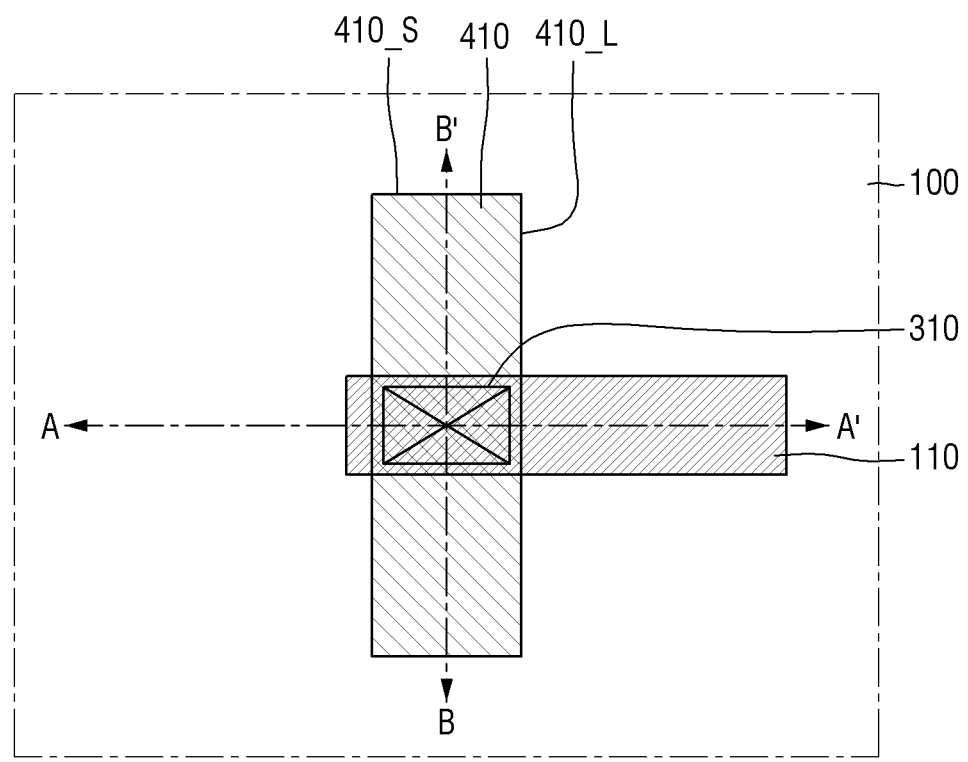
FIG. 1 is a layout diagram of a semiconductor device according to some embodiments of the present inventive concept.
Figure 1:
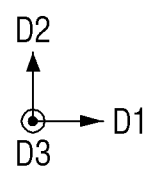
Figure 2:
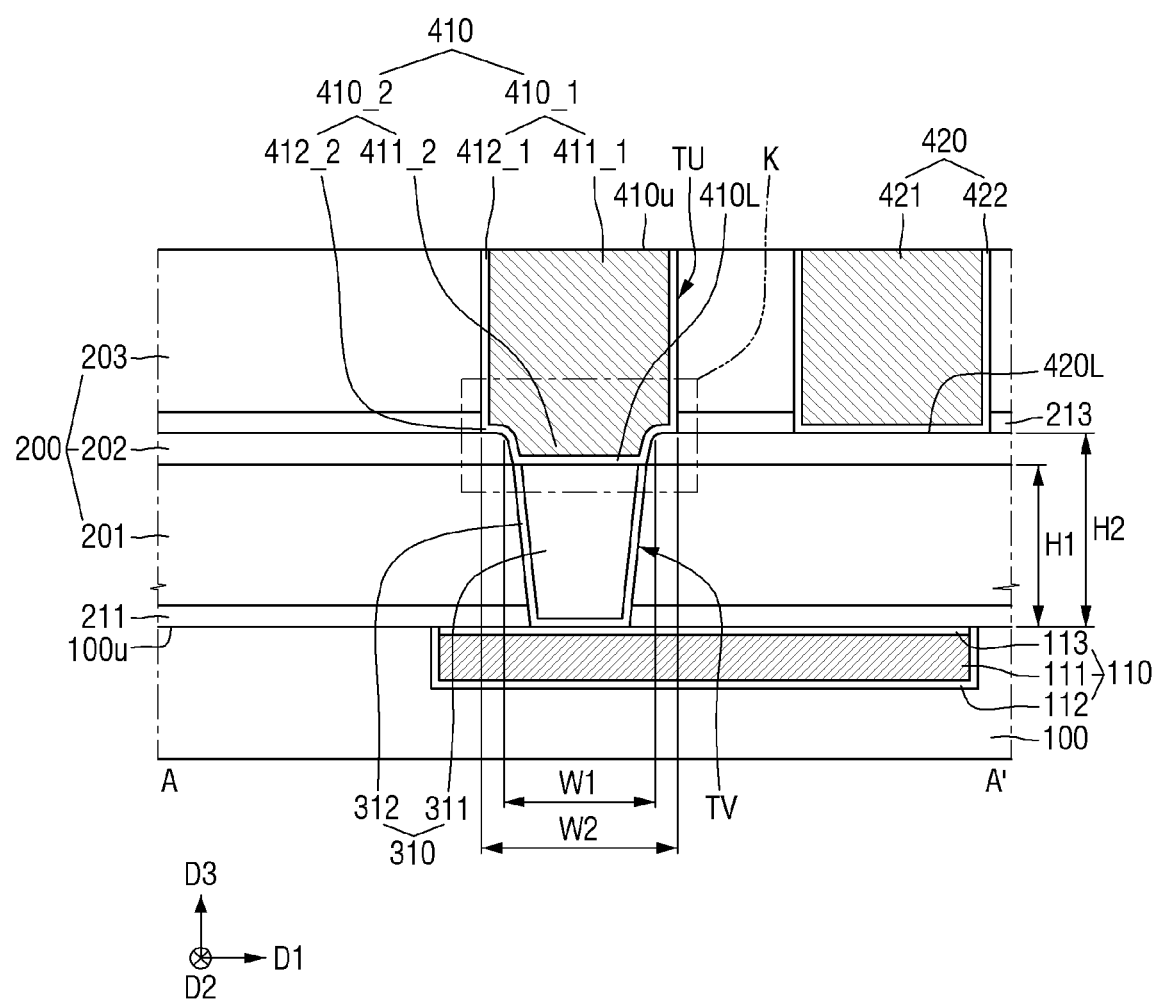
FIG. 2 is a cross-sectional view taken along line A-A' of FIG. 1.
Figure 3:
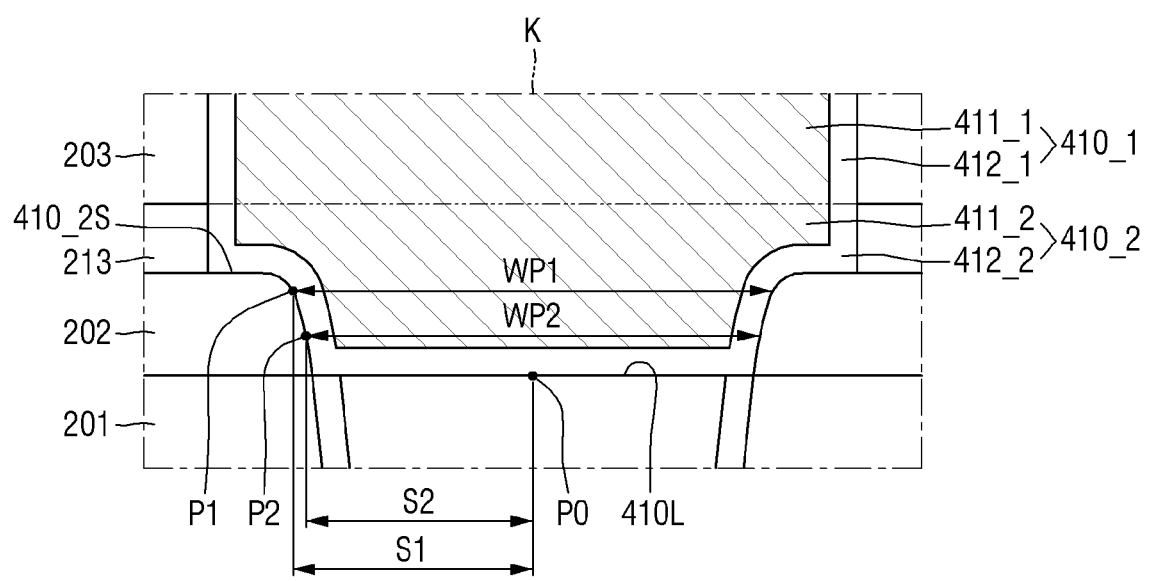
FIG. 3 is an enlarged view of a region K of FIG. 2.
Figure 4:
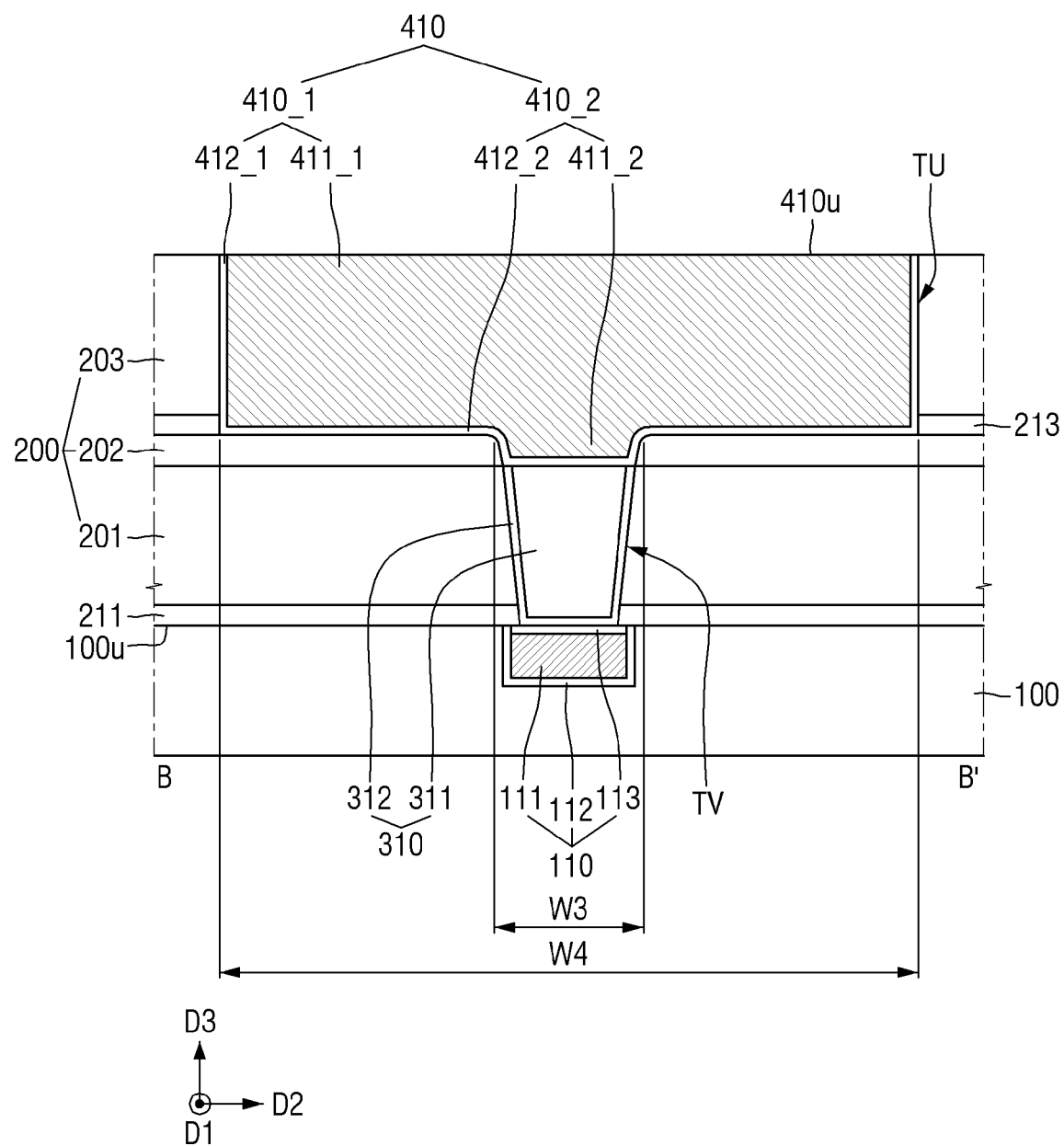
FIG. 4 is a cross-sectional view taken along line B-B' of FIG. 1.

FIG. 1 is a layout diagram of a semiconductor device according to some embodiments of the present inventive concept. FIG. 2 is a cross-sectional view taken along line A-A' of FIG. 1. FIG. 3 is an enlarged view of a region K of FIG. 2. FIG. 4 is a cross-sectional view taken along line B-B' of FIG. 1.

In FIG. 1, an interlayer insulating film (200 of FIG. 2), a lower capping film (113 of FIG. 2), and a second upper wiring (420 of FIG. 2) are not illustrated for clarity of description.

Referring to FIGS. 1 to 4, a semiconductor device according to some embodiments of the present inventive concept includes a substrate 100, a lower wiring 110, an interlayer insulating film 200, a via 310, a first upper wiring 410, and a second upper wiring 420.

In some embodiments, the lower wiring 110 and the first upper wiring 410 may extend in directions intersecting with each other. For example, the lower wiring 110 may extend in a first direction D1. The first upper wiring 410 may extend in a second direction D2 intersecting with the first direction D1. The via 310 may extend along a third direction D3 in a region in which the first upper wiring 410 and the lower wiring 110 overlap each other.

The first direction D1 may be, for example, a direction substantially parallel to an upper surface 100U of the substrate 100. The third direction D3 may be, for example, a direction away from the upper surface 100U of the substrate 100 (i.e., a direction perpendicular to the upper surface 100U of the substrate). The second direction D2 may be a direction intersecting with the first direction D1 and the third direction D3.

The first upper wiring 410 may include a short side 410_S extending in the first direction D1, and a long side 410_L extending in the second direction D2. The short side 410_S of the first upper wiring 410 may be connected to the long side 410_L of the first upper wiring 410. According to exemplary embodiment, the length of the short side 410_S of the first upper wiring 410 extending in the first direction D1 is smaller than the length of the long side 410_L extending in the second direction D2.

The lower wiring 110 may extend along the first direction D1, which is a direction in which the short side 410_S of the first upper wiring 410 extends. Details of the first upper wiring 410, the lower wiring 110 and the via 310 will be described later.

The substrate 100 may have a structure in which a base substrate and an epitaxial layer are stacked with each other, but the technical idea of the present inventive concept is not limited thereto. The substrate 100 may be a silicon substrate, a gallium arsenide substrate, a silicon germanium substrate, a ceramic substrate, a quartz substrate, a display glass substrate, or the like, and may be an SOI (semiconductor-on-insulator) substrate. Hereinafter, a silicon substrate will be described as an example, but the disclosure is not limited thereto. Further, the substrate 100 may have a form in which an insulating film is formed on a silicon substrate.

The substrate 100 may include a lower wiring 110. In some embodiments, the lower wiring 110 may include a conductive material.

In the semiconductor device according to some embodiments of the present inventive concept, the lower wiring 110 will be described as a metal wiring, but this is for convenience of explanation, and the technical idea of the present inventive concept is not limited thereto. It is a matter of course that the lower wiring 110 may be a transistor, a diode, or the like formed in the substrate 100, and, for example, may be a gate electrode of a transistor or a source/drain of a transistor.

The lower wiring 110 may include a lower wiring film 111, a lower barrier film 112, and a lower capping film 113.

The lower wiring film 111 may be disposed in, for example, the substrate 100. The lower wiring film 111 may include, for example, at least one of aluminum (Al), copper (Cu), tungsten (W), cobalt (Co), and combinations thereof.

The lower capping film 113 may be disposed on the lower wiring film 111. The lower capping film 113 may be disposed, for example, in the substrate 100. However, the technical idea of the present inventive concept is not limited thereto. For example, in some embodiments, at least a part of the lower capping film 113 may protrude from the upper surface 100U of the substrate 100. Also, in some embodiments, the lower capping film 113 may of course be omitted. The lower capping film 113 may include, for example, copper (Cu).

The lower barrier film 112 may be disposed between the lower wiring film 111 and the substrate 100, and between the lower capping film 113 and the substrate 100. For example, the lower barrier film 112 may be disposed in a recess in the substrate 100 along a bottom surface and sidewalls of the recess. The lower wiring film 111 and the lower capping film 113 may fill a remaining part which is left after the lower barrier film 112 is disposed in the recess. Although the lower barrier film 112 is illustrated as a single film, the lower barrier film 112 may, of course, include a plurality of layers. The lower barrier film 112 may include, but is not limited to, at least one of tantalum, tantalum nitride, titanium, titanium nitride, ruthenium, cobalt, nickel, nickel boron (NiB), and tungsten nitride.

A first etch stop film 211 may be disposed on the substrate 100 including the lower wiring 110. In the drawings, the first etch stop film 211 is illustrated as a single layer, but the technical idea of the present inventive concept is not limited thereto. For example, it is a matter of course that the first etch stop film 211 has a structure in which two or more layers are stacked.

The first etch stop film 211 may include a material having etching selectivity with a material included in the first region 201 of the interlayer insulating film 200. For example, the first etch stop film 211 may include a metal element.

The interlayer insulating film 200 may be disposed on the first etch stop film 211. The interlayer insulating film 200 may include a first interlayer insulating film, and a second interlayer insulating film on the first interlayer insulating film. The first interlayer insulating film may include a first region 201 and a second region 202. The second interlayer insulating film may include a third region 203.

The first region 201 of the interlayer insulating film 200 may be disposed on the first etch stop film 211.

The first region 201 of the interlayer insulating film 200 may include, for example, at least one of silicon oxide, silicon nitride, silicon oxynitride and a low-dielectric constant material. However, the technical idea of the present inventive concept is not limited thereto. For example, the first region 201 of the interlayer insulating film 200 may include a material having an etching selection ratio with the material included in the first etch stop film 211.

The second region 202 of the interlayer insulating film 200 may be disposed on the first region 201 of the interlayer insulating film 200. The second region 202 of the interlayer insulating film 200 may protrude from the first region 201 of the interlayer insulating film 200. The second region 202 of the interlayer insulating film 200 may expose the via 310.

In some embodiments, the second region 202 of the interlayer insulating film 200 and the first region 201 of the interlayer insulating film 200 may contain the similar material. For example, the dielectric constant of the material contained in the second region 202 of the interlayer insulating film 200 may be different from the dielectric constant of the material included in the first region 201 of the interlayer insulating film 200. For example, the dielectric constant of the material contained in the second region 202 of the interlayer insulating film 200 may smaller than the dielectric constant of the material contained in the first region 201 of the interlayer insulating film 200.

Alternatively, in some embodiments, the second region 202 of the interlayer insulating film 200 and the first region 201 of the interlayer insulating film 200 may include the same material having the same dielectric constant.

The second etch stop film 213 may be disposed in the second region 202 of the interlayer insulating film 200. In the drawings, the second etch stop film 213 is illustrated as a single film, but the technical idea of the present inventive concept is not limited thereto. For example, it is a matter of course that the second etch stop film 213 may have a structure in which two or layers are stacked.

The second etch stop film 213 may include a material having etching selectivity with the material included in the third region 203 of the interlayer insulating film 200. For example, the second etch stop film 213 may contain a metal element.

The third region 203 of the interlayer insulating film 200 may be disposed on the second etch stop film 213.

The third region 203 of the interlayer insulating film 200 may include, for example, at least one of silicon oxide, silicon nitride, silicon oxynitride and a low-dielectric constant material. However, the technical idea of the present inventive concept is not limited thereto. For example, the third region 203 of the interlayer insulating film 200 may include a material having an etching selection ratio with the material included in the second etch stop film 213.

According to exemplary embodiments, the first etch stop film 211, the first region 201 of the first interlayer insulating film, second region 202 of the first interlayer insulating film, the second etch stop film 213, and the third region 203 of the second interlayer insulating film are sequentially provided on the upper surface 100u of the substrate 100. According to exemplary embodiments, material compositions of the first region 201 of the first interlayer insulating film are uniformly provided throughout the first region 201, material compositions of the second region 202 of the first interlayer insulating film are uniformly provided throughout the second region 202, and material compositions of the third region 203 of the second interlayer insulating film are uniformly provided throughout the third region 203. According to exemplary embodiments, the first interlayer insulating film including the first region 201 and the second region 202 and the second interlayer insulating film including the third region 203 form the interlayer insulating film 200.

A trench may be formed in the interlayer insulating film 200, the first etch stop film 211 and the second etch stop film 213 to penetrate the interlayer insulating film 200, the first etch stop film 211, and the second etch stop film 213. The trench may include a first portion, a second portion, and a third portion. The trench may also be referred to as an opening.

The first portion of the trench may be a portion defined by the first etch stop film 211 and the first region 201 of the interlayer insulating film 200. The second portion of the trench can be a portion defined by the second region 202 of the interlayer insulating film 200. The third portion of the trench may be a portion defined by the second etch stop film 213 and the third region 203 of the interlayer insulating film 200.

The trench may include a via trench TV and a first upper wiring trench TU. The via trench TV may be an opening which is not elongated. Thus, the via trench TV may also be referred to as via opening. The via trench TV may correspond to the first portion of the trench. The first upper wiring trench TU may correspond to the second portion of the trench and the third portion of the trench. The third portion of the trench may be elongated to form horizontal wiring.

The via trench TV may pass through the first region 201 of the interlayer insulating film 200 and the first etch stop film 211, in the first region 201 of the interlayer insulating film 200 and the first etch stop film 211. The via trench TV may expose the lower wiring 110.

The first upper wiring trench TU may be formed in the second region 202 of the interlayer insulating film 200, the second etch stop film 213, and the third region 203 of the interlayer insulating film 200.

In some embodiments, the first upper wiring trench TU may be formed after the via 310 is formed. In this case, the first upper wiring trench TU may expose the via 310.

The via 310 may be disposed in the first region 201 of the interlayer insulating film 200. The via 310 penetrates the first etch stop film 211 and may be connected to the lower wiring 110.

The via 310 may include a via material 311 and a via barrier film 312. The via barrier film 312 may be disposed along the sidewalls and the bottom surface of the via trench TV. The via material 311 may fill the remaining part that is left after the via barrier film 312 is disposed in the via trench TV.

The via material 311 may include, but is not limited to, at least one of aluminum (Al), copper (Cu), tungsten (W), cobalt (Co), and combinations thereof. The via barrier film 312 may include, but is not limited to, at least one of tantalum, tantalum nitride, titanium, titanium nitride, ruthenium, cobalt, nickel, nickel boron (NiB), and tungsten nitride.

The first upper wiring 410 may be disposed in the third region 203 of the interlayer insulating film 200, the second etch stop film 213, and the second region 202 of the interlayer insulating film 200. The first upper wiring 410 is spaced apart from the lower wiring 110 and may be disposed on the via 310. The first upper wiring 410 may be connected to the lower wiring 110 via the via 310.

The first upper wiring 410 may include a first upper wiring film and a first upper barrier film. The first upper wiring film may include a first upper wiring film portion 411_1 and a second upper wiring film portion 411_2. The first upper barrier film may include a first upper barrier film portion 412_1 and a second upper barrier film portion 412_2.

The first upper barrier film portion 412_1 and the second upper barrier film portion 412_2 may be disposed along the sidewalls and the bottom surface of the first upper wiring trench TU. The first upper barrier film portion 412_1 of the first upper barrier film may be a portion disposed in the third region 203 of the interlayer insulating film 200. The second upper barrier film portion 412_2 of the first upper barrier film may be a portion disposed in the second etch stop film 213 and the second region 202 of the interlayer insulating film 200. In some embodiments, the second upper barrier film portion 412_2 of the first upper barrier film may contact the via 310 and may be conformally formed along the sidewalls and the bottom surface of the first upper wiring trench TU. The sidewalls of the first upper wiring trench TU in the second region 202 are aligned with and/or flush with sidewalls of the via trench TV.

The first upper barrier film portion 412_1 and the second upper barrier film portion 412_2 may include, but is not limited to, at least one of tantalum, tantalum nitride, titanium, titanium nitride, ruthenium, cobalt, nickel, nickel boron (NiB), and tungsten nitride. The material compositions of the first upper barrier film portion 412_1 may be uniformly provided and the material compositions of the second upper barrier film portion 412_2 may be uniformly provided.

The first upper wiring film portion 411_1 and the second upper wiring film portion 411_2 may fill the remaining part which is left after the first and second upper barrier film portions 412_1 and 412_2 are disposed in the first upper wiring trench TU. The first upper wiring film portion 411_1 of the first upper wiring film may be a portion disposed in the third region 203 of the interlayer insulating film 200. The second upper wiring film portion 411_2 of the first upper wiring film may be a portion disposed in the second etch stop film 213 and the second region 202 of the interlayer insulating film 200.

The first and second upper wiring film portions 411_1 and 411_2 may include, for example, at least one of aluminum (Al), copper (Cu), tungsten (W), cobalt (Co), and combinations thereof. The material compositions of the first upper wiring film portion 411_1 may be uniformly provided and the material compositions of the second upper wiring film portion 411_2 may be uniformly provided.

In some embodiments, the upper capping films on the first and second upper wiring film portions 411_1 and 411_2 may be further disposed.

The first portion 410_1 of the first upper wiring 410 may be a portion of the first upper wiring 410 disposed in the third region 203 of the interlayer insulating film 200. The second portion 410_2 of the first upper wiring 410 may be a portion of the first upper wiring 410 disposed in the second etch stop film 213 and the second region 202 of the interlayer insulating film 200.

The second portion 410_2 of the first upper wiring 410 may include a portion located in the second etch stop film 213, and a portion disposed in the second region 202 of the interlayer insulating film 200. A portion of the second portion 410_2 of the first upper wiring 410 disposed in the second etch stop film 213 may be disposed on a portion disposed in the second region 202 of the interlayer insulating film 200.

The sidewalls of the second portion 410_2 of the first upper wiring 410 may include a stepwise shape. The sidewalls of the second portion 410_2 of the first upper wiring 410 may be, for example, a part of the sidewalls of the first upper wiring 410 extending from a lower surface 401L of the first upper wiring 410 to a boundary between the second etch stop film 213 and the third region 203 of the interlayer insulating film 200.

At the boundary between the second etch stop film 213 and the second region 202 of the interlayer insulating film 200, the second portion 410_2 of the first upper wiring 410 may have a first width W1 in a first direction D1 (see, e.g., FIG. 2) and a third width W3 in a second direction D2 (see, e.g., FIG. 4), in the second region 202 of the interlayer insulating film 200. For example, at the boundary between the second etch stop film 213 and the second region 202 of the interlayer insulating film 200, the portion of the first upper wiring 410 in the second region 202 of the interlayer insulating film 200 may have the first width W1 in the first direction D1 and the third width W3 in the second direction D2. In this exemplary embodiment, the portion of the first upper wiring 410 filling the second portion of the trench may have the first width W1 the first direction D1 and the third width W3 in the second direction D2.

At the boundary between the second etch stop film 213 and the second region 202 of the interlayer insulating film 200, a second portion 410_2 of the first upper wiring 410 in the second etch stop film 213 may have a second width W2 in the first direction D1 (see, e.g., FIG. 2) and a fourth width W4 in the second direction D2 (see, e.g., FIG. 4). For example, at the boundary between the second etch stop film 213 and the second region 202 of the interlayer insulating film 200, the portion of the first upper wiring 410 within the second etch stop film 213 may have the second width W2 in the first direction D1 and the fourth width W4 in the second direction D2. In this exemplary embodiment, the portion of the first upper wiring 410 filling the third portion of the trench may have the second width W2 in the first direction D1 and the fourth width W4 in the second direction D2.

In some embodiments, the first width W1 may be smaller than the second width W2. Also, the third width W3 may be smaller than the fourth width W4.

The sidewalls of the first upper wiring 410 may include a first sidewall 410_2S. The first sidewall 410_2S of the first upper wiring 410 may extend from the lower surface 410L of the first upper wiring 410 to the boundary between the second etch stop film 213 and the second region 202 of the interlayer insulating film 200.

For example, the first sidewall 410_2S of the first upper wiring 410 may be a sidewall of the first upper wiring 410 in the second region 202 of the interlayer insulating film 200. Further, for example, the first sidewall 410_2S of the first upper wiring 410 may be the sidewall of the first upper wiring 410 which fills the second portion of the trench.

The first sidewall 410_2S of the first upper wiring 410 may include a first point S1 spaced apart from a reference point P0 of the lower surface 410L of the first upper wiring 410 by a first distance P1. Further, the first sidewall 410_2S of the first upper wiring 410 may include a second point P2 spaced apart from the reference point P0 of the lower surface 410L of the first upper wiring 410 by a second distance S2. The first distance S1 may be greater than the second distance S2. In some embodiments, the reference point P0 may refer to the midpoint of the lower surface 410L in a horizontal axis parallel to the first direction D1.

The width WP1 of the first upper wiring 410 at the first point P1 may be greater than the width WP2 of the first upper wiring 410 at the second point P2. Here, the width WP1 and width WP2 may be values measured along the first direction D1.

For example, in the second region 202 of the interlayer insulating film 200, the width in the first direction D1 and the width in the second direction D2 of the first upper wiring 410 may decrease from the upper surface 410U of the first upper wiring 410 toward the lower surface 410L of the first upper wiring 410. In this exemplary embodiment, each of the width in the first direction D1 and the width in the second direction D2 of the first upper wiring 410 filling the second portion of the trench may decrease from the upper surface 410U of the first upper wiring 410 toward the lower surface 410L of the first upper wiring 410.

In some embodiments, in FIG. 2 which is a cross-sectional view taken along the line A-A' extending along the first direction D1 of FIG. 1, the sidewalls of the second portion 410_2 of the first upper wiring 410 may include a stepwise shape. Also, in FIG. 4 which is a cross-sectional view taken along the line B-B' extending along the second direction D2 of FIG. 1, the sidewalls of the second portion 410_2 of the first upper wiring 410 may also include a stepwise shape. Furthermore, in some embodiments, even in the cross-sectional view which is present on a plane defined by the first direction D1 and the second direction D2 and taken in another direction intersecting with the first direction D1 and the second direction D2, the sidewall of the second portion 410_2 of the first upper wiring 410 may also include a stepwise shape.

The second upper wiring 420 may be disposed in the third region 203 of the interlayer insulating film 200 and the second etch stop film 213. The second upper wiring 420 may be disposed to be spaced apart from the first upper wiring 410. The second upper wiring 420 may be disposed to be spaced apart from the via 310. The second upper wiring 420 may be disposed on the lower wiring 110 so as to be spaced apart from the lower wiring 110. The second upper wiring 420 may not be connected to the lower wiring 110.

The second upper wiring 420 may include a second upper wiring film 421 and a second upper barrier film 422. The second upper barrier film 422 is formed between the second upper wiring film 421 and the third region 203 of the interlayer insulating film 200, between the second upper wiring film 421 and the second etch stop film 213, and between the second upper wiring film 421 and the second region 202 of the interlayer insulating film 200.

The second upper wiring film 421 may include, for example, but is not limited to, at least one of aluminum (Al), copper (Cu), tungsten (W), cobalt (Co), and combinations thereof. The second upper barrier film 422 may include, but it is not limited to, at least one of tantalum, tantalum nitride, titanium, titanium nitride, ruthenium, cobalt, nickel, nickel boron (NiB), tungsten nitride.

The second upper wiring 420 may not include a portion extending into the second region 202 of the interlayer insulating film 200. Therefore, a first height H1 from the upper surface 100U of the substrate 100 to the lower surface 410L of the first upper wiring 410 may be smaller than a second height H2 to the lower surface 420L of the second upper wiring 420. In some embodiments, the lower surface 420 L of the second upper wiring 420 is at the same level as the surface of the first sidewall 410_2S of the first upper wiring 410 corresponding to the boundary between the second etch stop film 213 and the second region 202 of the interlayer insulating film 200 in the third direction D3. In some embodiments, the lower surface 420 L of the second upper wiring 420 is at the same level as the surface of the second upper barrier film portion 412_2 of the first upper barrier film corresponding to the upper surface of the second region 202 of the interlayer insulating film 200 in the third direction D3. In some embodiments, the lower surface 420 L of the second upper wiring 420 is at the same level as the lower surface of the second etch stop film 213 in the third direction D3.

In a semiconductor device according to some embodiments of the present inventive concept, a part of the first upper wiring 410 connected to the lower wiring 110 via the via 310 may extend to the second region 202 of the interlayer insulating film 200 disposed below the second etch stop film 213. At this time, since the sidewalls of the first upper wiring 410 include the stepwise shape in the second etch stop film 213 and the second region 202 of the interlayer insulating film 200, the first upper wiring 410 may be aligned with the via 310. Since the first upper wiring 410 is aligned with the via 310, it is possible to reduce a short circuit phenomenon not only between the first upper wiring 410 and the via 310 but also between the first upper wiring 410 and the lower wiring 110. Since the sidewalls of the first upper wiring 410 include the stepwise shape in the second etch stop film 213 and the second region 202 of the interlayer insulating film 200, it is possible to secure a portion of the first upper wiring 410 connected to the via 310. In addition, when recess formed in the second region 202 of the interlayer insulating film 200 (see FIG. 13) or via recess (310r of FIG. 16) entirely expose the upper surface of the via 310, thereby filling the recess formed in the second region 202 of the interlayer insulating film 200 (see FIG. 13) or the via recess (310r of FIG. 16) in the subsequent process, the first upper wiring 410 aligned with the via 310 may be implemented.

The semiconductor device may be in the form of, for example, a semiconductor chip or die, formed from a semiconductor wafer.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. In addition, in certain cases, even if a term is not described using "first," "second," etc., in the specification, it may still be referred to as "first" or "second" in a claim in order to distinguish different claimed elements from each other.

A semiconductor device according to some embodiments of the present inventive concept will be described below with reference to FIGS. 5 to 7. For clarity of explanation, repeated part of the aforementioned description will not be described.

Figure 5:
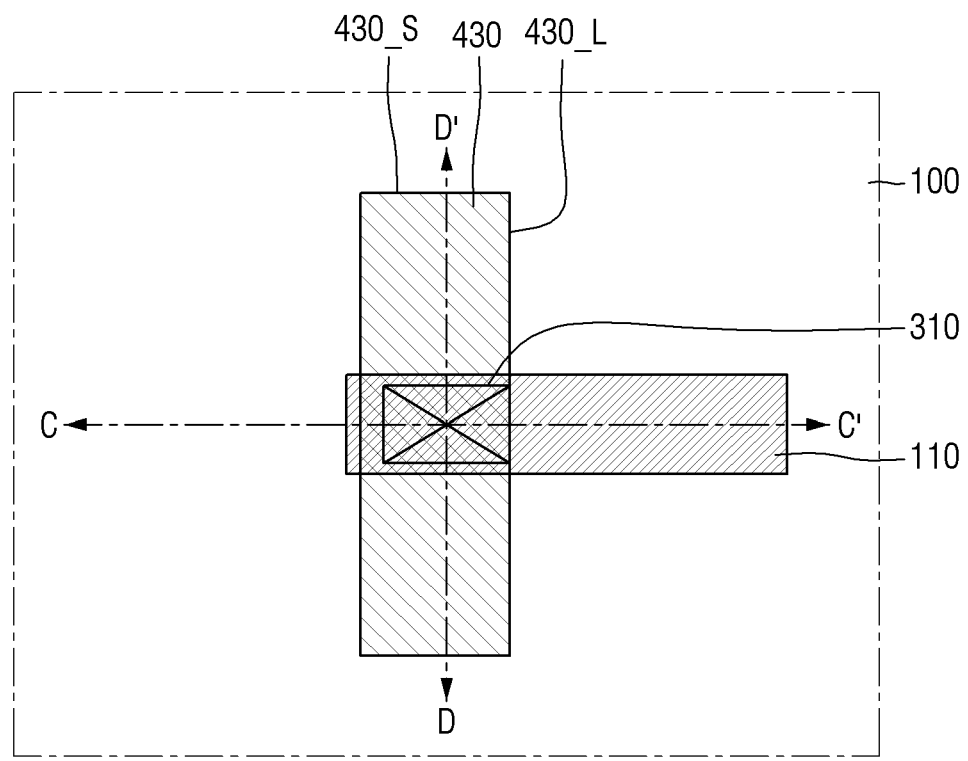
FIG. 5 is a layout diagram of a semiconductor device according to some embodiments of the present inventive concept.

FIG. 5 is a layout diagram of a semiconductor device according to some embodiments of the present inventive concept. FIG. 6 is a cross-sectional view taken along the line C-C' of FIG. 5. FIG. 7 is an enlarged view of a region J of FIG. 6.

In FIG. 5, the interlayer insulating film (200 of FIG. 6) and the second upper wiring (420 of FIG. 6) are not illustrated for clarity of description. The cross-sectional view taken along the line D-D' of FIG. 5 may be substantially the same as that of FIG. 4.

Figure 6:
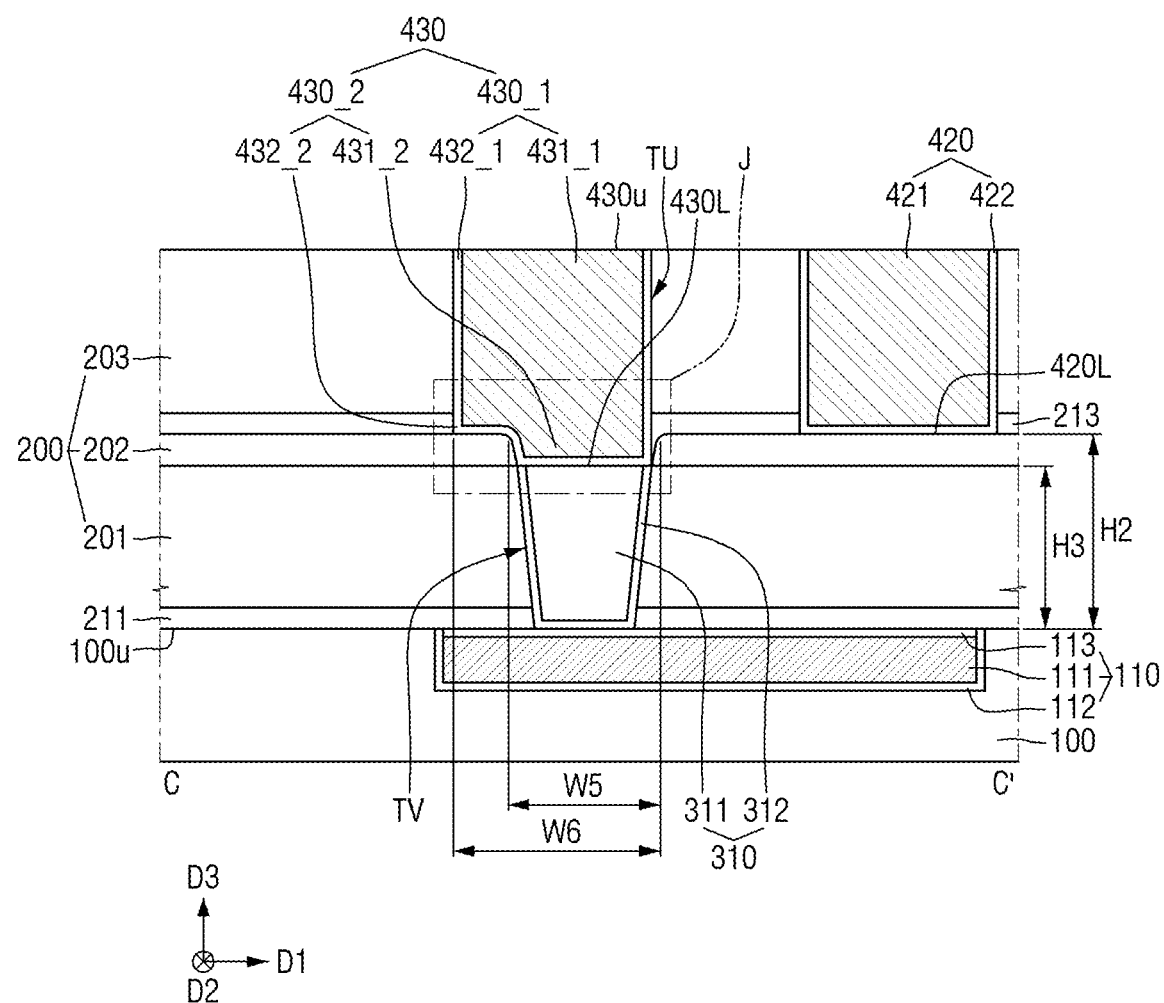
FIG. 6 is a cross-sectional view taken along the line C-C' of FIG. 5.
Figure 7:
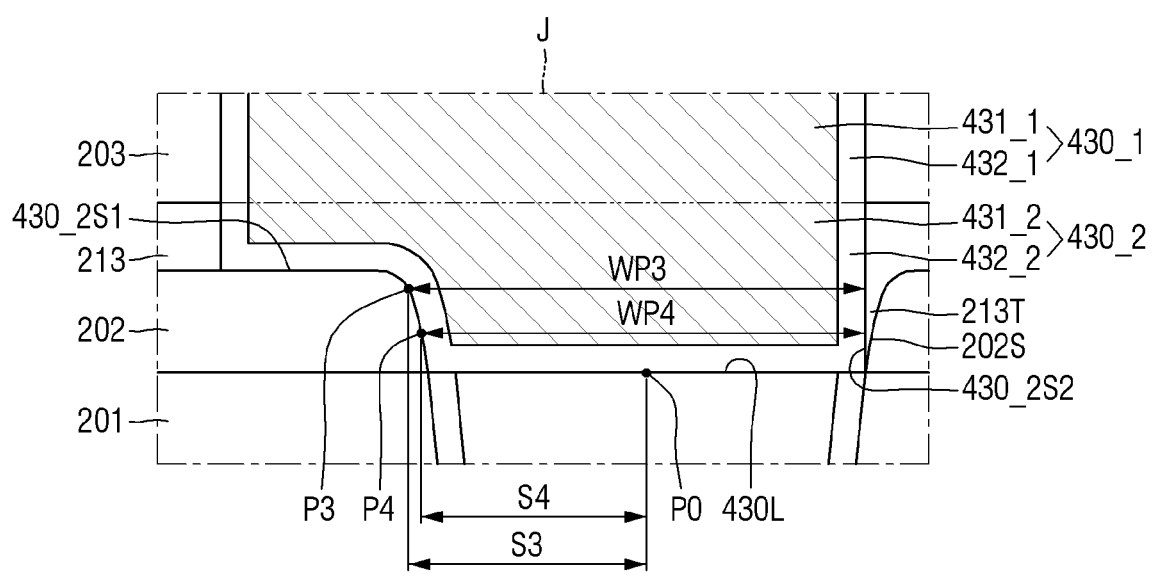
FIG. 7 is an enlarged view of a region J of FIG. 6.

Referring to FIGS. 5 to 7, the third upper wiring 430 may include a first portion 430_1 and a second portion 430_2.

The third upper wiring 430 may include a short side 430_S extending in the first direction D1, and a long side 430_L extending in the second direction D2. The short side 430_S of the third upper wiring 430 and the long side 430_L of the third upper wiring 430 may be connected to each other.

The third upper wiring 430 may include a third upper wiring film and a third upper barrier film. The third upper wiring film may include a first wiring film portion 431_1 and a second wiring film portion 431_2. The third upper barrier film may include a first barrier film portion 432_1 and a second barrier film portion 432_2.

The first portion 430_1 of the third upper wiring 430 may be a portion of the third upper wiring 430 disposed in the third region 203 of the interlayer insulating film 200. The first portion 430_1 of the third upper wiring 430 may include the first wiring film portion 431_1 of the third upper wiring film, and the first barrier film portion 432_1 of the third upper barrier film.

The second portion 430_2 of the third upper wiring 430 may be a portion of the third upper wiring 430 disposed in the second etch stop film 213 and the second region 202 of the interlayer insulating film 200. The second portion 430_2 of the third upper wiring 430 may include the second wiring film portion 431_2 of the third upper wiring film, and the second barrier film portion 432_2 of the third upper barrier film.

At a boundary between the second etch stop film 213 and the second region 202 of the interlayer insulating film 200, the second portion 430_2 of the third upper wiring 430 in the second region 202 of the interlayer insulating film 200 may have a fifth width W5. For example, at the boundary between the second etch stop film 213 and the second region 202 of the interlayer insulating film 200, the portion of the third upper wiring 430 in the second region 202 of the interlayer insulating film 200 may have a fifth width W5. In this exemplary embodiment, the portion of the third upper wiring 430 filling the second portion of the trench may have the fifth width W5.

At the boundary between the second etch stop film 213 and the second region 202 of the interlayer insulating film 200, a second portion 430_2 of the third upper wiring 430 in the second etch stop film 213 may have a sixth width W6. For example, at the boundary between the second etch stop film 213 and the second region 202 of the interlayer insulating film 200, the portion of the third upper wiring 430 in the second etch stop film 213 may have the sixth width W6. In this exemplary embodiment, the portion of the third upper wiring 430 filling the third portion of the trench may have the sixth width W6.

The fifth width W5 and the sixth width W6 may be values measured along the first direction D1 in which the short side 430_S of the third upper wiring 430 extends. In some embodiments, the fifth width W5 may be smaller than the sixth width W6.

One of the sidewalls of the second portion 430_2 of the third upper wiring 430 may include a stepwise shape. In some embodiments, one of the sidewalls of the second portion 430_2 of the third upper wiring 430 may also include a stepwise shape in a cross-sectional view (e.g., FIG. 6) taken along the first direction D1 as well as in the cross-sectional view (e.g., FIG. 4) taken along the second direction D2.

The third upper wiring 430 may include one sidewall and the other sidewall having different shapes.

The one sidewall of the second portion 430_2 of the third upper wiring 430 may include a stepwise shape. For example, the one sidewall of the second portion 430_2 of the third upper wiring 430 may be a portion of the sidewall of the third upper wiring 430, which extends from the lower surface 430L of the third upper wiring 430 to the boundary between the second etch stop film 213 and the third region 203 of the interlayer insulating film 200. The one sidewall of the third upper wiring 430 may include a second sidewall 430_2S1. The second sidewall 430_2S1 of the third upper wiring 430 may extend from the lower surface 430L of the third upper wiring 430 to the boundary between second etch stop film 213 and the second region 202 of the interlayer insulating film 200.

For example, the second sidewall 430_2S1 of the third upper wiring 430 may be a sidewall of the third upper wiring 430 in the second region 202 of the interlayer insulating film 200. Also, for example, the second sidewall 430_2S1 of the third upper wiring 430 may be one sidewall of the third upper wiring 430 which fills the second portion of the trench.

The second sidewall 430_2S1 of the third upper wiring 430 may include a third point P3 separated from the reference point P0 of the lower surface 430L of the third upper wiring 430 by a third distance S3. Further, the second sidewall 430_2S1 of the third upper wiring 430 may include a fourth point P4 separated from the reference point P0 of the lower surface 430L of the third upper wiring 430 by a fourth distance S4. The third distance S3 may be larger than the fourth distance S4. In some embodiments, the reference point P0 may refer to the midpoint of the lower surface 430L of the third upper wiring 430 in a horizontal axis parallel to the first direction D1.

The width WP3 of the third upper wiring 430 at the third point P3 may be larger than the width WP4 of the third upper wiring 430 at the fourth point P4. Here, the width WP3 and the width WP4 may be the values measured along the first direction D1.

For example, each of the width in the first direction D1 and the width in the second direction D2 of the third upper wiring 430 in the second region 202 of the interlayer insulating film 200 may decrease in the direction from the upper surface 430U of the upper wiring 430 toward the lower surface 430L of the third upper wiring 430. In this exemplary embodiment, each of the width in the first direction D1 and the width in the second direction D2 of the third upper wiring 430 filling the second portion of the trench may decrease in the direction from the upper surface 430U of the third upper wiring 430 toward the lower surface 430L of the third upper wiring 430.

The other sidewall of the second portion 430_2 of the third upper wiring 430 may not include in a stepwise shape. For example, the other sidewall of the second portion 430_2 of the third upper wiring 430 may be a portion of the sidewall of the third upper wiring 430, which extends from the lower surface 430L of the third upper wiring 430 to the upper surface of the second etch stop film 213. The other sidewall of the third upper wiring 430 may include a third sidewall 430_2S2. The third sidewall 430_2S2 of the third upper wiring 430 may extend from the lower surface 430L of the third upper wiring 430 to the sidewall portion of the third upper wiring 430 adjacent to the upper surface of the second etch stop film 213.

The second region 202 of the interlayer insulating film 200 may include a sidewall 202S adjacent to the third sidewall 430_2S2 of the third upper wiring 430. Since the third sidewall 430_2S2 of the third upper wiring 430 does not include a stepwise shape, a space 213T may occur between the sidewall 202S of the second region 202 of the interlayer insulating film 200 and the third sidewall 430_2S2 of the third upper wiring 430. The space 213T between the sidewall 202S of the second region 202 of the interlayer insulating film 200 and the third sidewall 430_2S2 of the third upper wiring 430 may be filled with the second etch stop film 213.

Even if the third sidewall 430_2S2 of the third upper wiring 430 does not include a stepwise shape, the third height H3 from the upper surface 100U of the substrate 100 to the lower surface 430L of the third upper wiring 430 may be smaller than the second height H2 to the lower surface 420L of the second upper wiring 420.

Hereinafter, the semiconductor devices according to some embodiments of the present inventive concept will be described with reference to FIGS. 1 and 8. For clarity of explanation, repeated parts of the aforementioned description will not be described.

Figure 8:
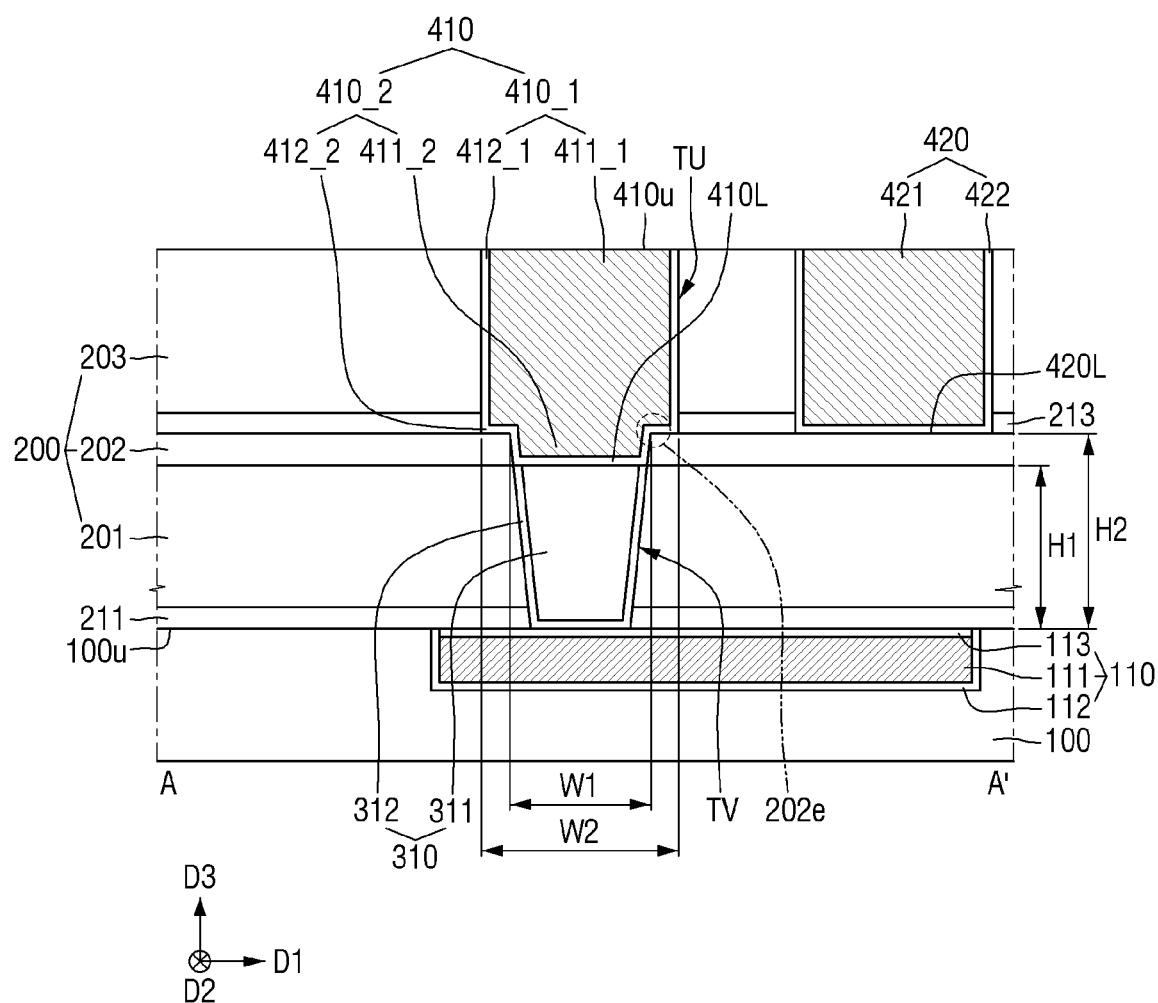
FIG. 8 is a cross-sectional view taken along line A-A' of FIG. 1.

FIG. 8 is a cross-sectional view taken along line A-A' of FIG. 1.

Referring to FIGS. 1 and 8, a corner region 202e of the sidewall of the second portion 410_2 of the first upper wiring 410 may not have a chamfered shape, unlike FIG. 2. In some embodiments, the first upper wiring 410 of FIG. 8 may be formed by filling a recess after forming the recess by removing a part of the upper part of the via 310. The recess in the upper part of the via 310 may be formed, for example, by removing a part of the upper part of the via 310, after forming the via 310 in the first region 201 and the second region 202 of the interlayer insulating film 200.

However, the technical idea of the present inventive concept is not limited thereto. For example, even in the case of filling the recess of the upper part of the via 310 to form the first upper wiring 410, the corner region 202e of the sidewall of the second portion 410_2 of the first upper wiring 410 may, of course, have a chamfered shape.

In some embodiments, the lower surface 420 L of the second upper wiring 420 is at the same level as the surface of the second sidewall 430_2S1 of the third upper wiring 430 corresponding to the boundary between the second etch stop film 213 and the second region 202 of the interlayer insulating film 200 in the third direction D3.

A method for fabricating the semiconductor device according to some embodiments of the present inventive concept will be described later.

A semiconductor device according to some embodiments of the present inventive concept will be described below with reference to FIGS. 1 and 9. For clarity of explanation, repeated parts of the aforementioned description will not be described.

Figure 9:
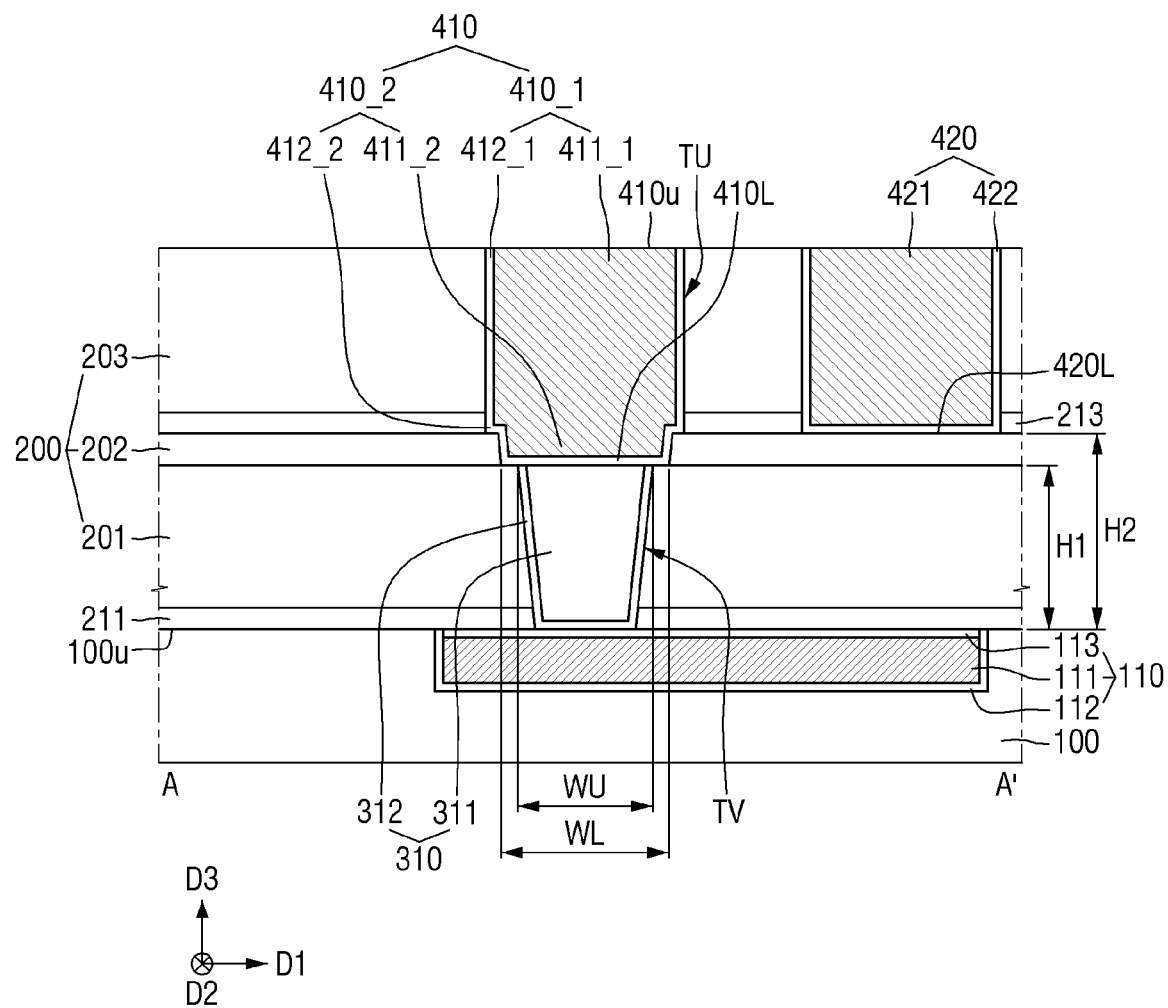
FIG. 9 is a cross-sectional view taken along line A-A' of FIG. 1.

FIG. 9 is a cross-sectional view taken along line A-A' of FIG. 1.

Referring to FIGS. 1 and 9, unlike FIGS. 2, 6 and 8, a width WL of the lower surface 410L of the first upper wiring 410 may be greater than a width WU of the upper surface of the via 310.

Hereinafter, a method for fabricating the semiconductor device according to some embodiments of the present inventive concept will be described with reference to FIGS. 10 to 15. For clarity of explanation, repeated parts of the aforementioned description will not be described.

FIGS. 10 to 15 are intermediate step diagrams for explaining the method for fabricating the semiconductor device according to some embodiments of the present inventive concept.

Figure 10:
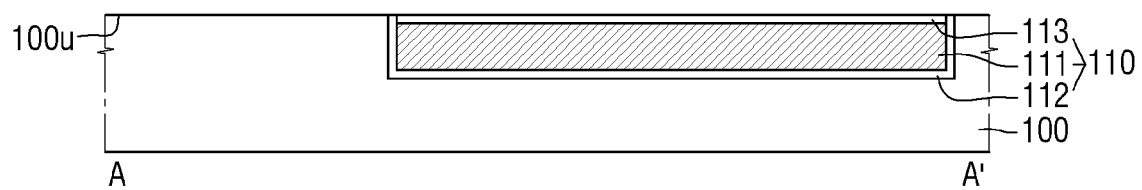
FIGS. 10 to 18 are intermediate step diagrams for explaining a method for fabricating a semiconductor device according to some embodiments of the present inventive concept.

Referring to FIG. 10, a substrate 100 including a lower wiring 110 may be provided.

Figure 11:
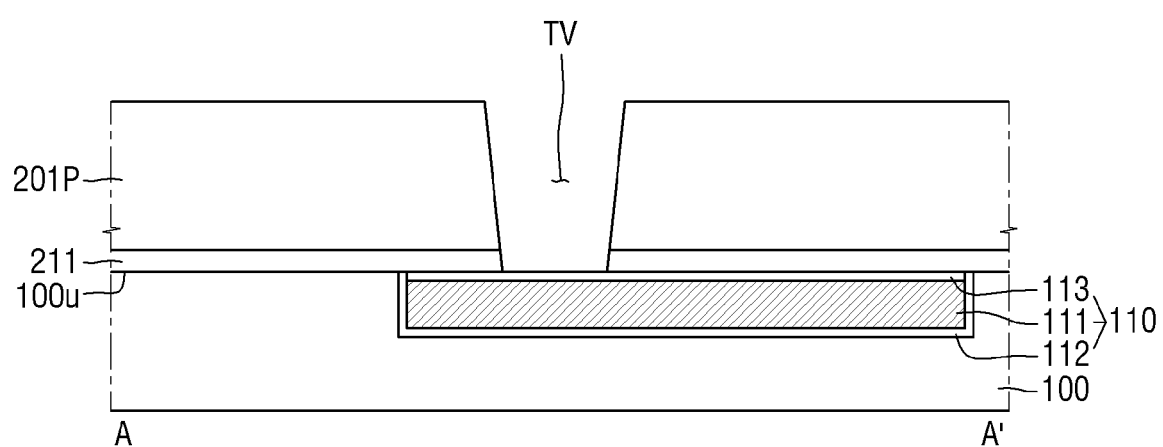

Referring to FIG. 11, a first etch stop film 211 and a pre-first interlayer insulating film 201P may be formed on the substrate 100. A via trench TV may be formed in the first etch stop film 211 and the pre-first interlayer insulating film 201P to penetrate the first etch stop film 211 and the pre-first interlayer insulating film 201P. The via trench TV may expose the lower wiring 110.

Figure 12:
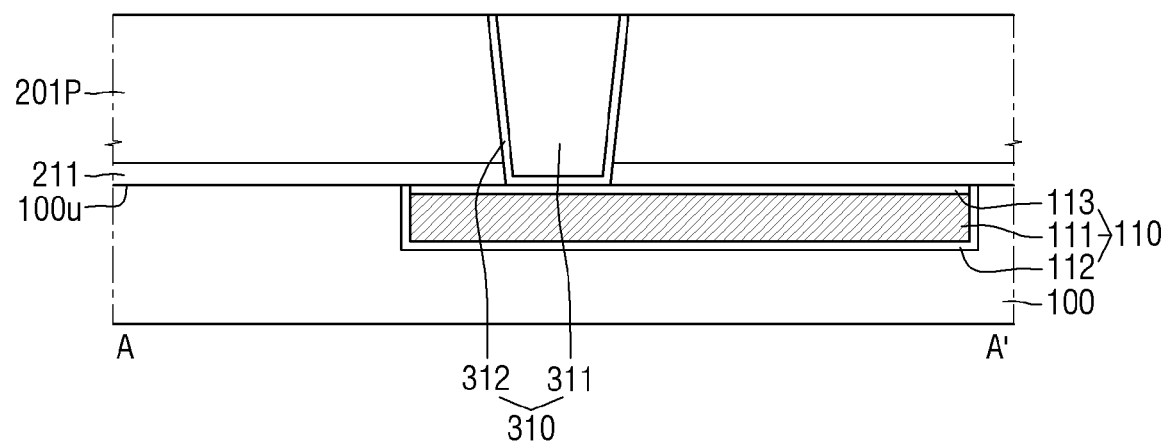

Referring to FIG. 12, the via 310 may be formed in the via trench TV. The via 310 may be connected to the lower wiring 110.

Figure 13:
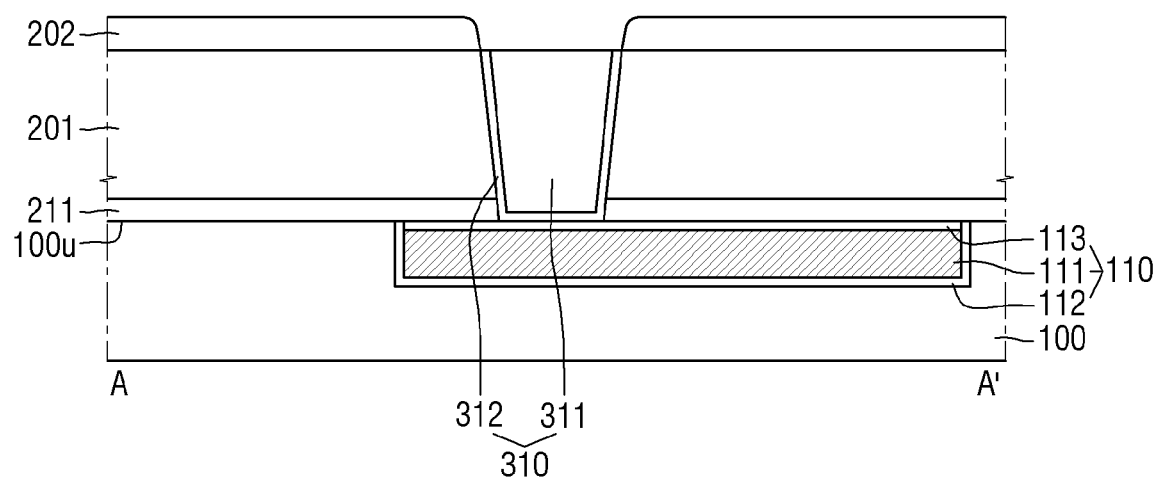

Referring to FIG. 13, after forming the via 310, a second region 202 of the interlayer insulating film may be formed on the pre-first interlayer insulating film 201P using selective dielectric deposition process or metal via etchback process. At this time, the first interlayer insulating film (201, 202) may be formed and a step is made through the selective dielectric deposition process or metal via etchback process. The second region 202 of the interlayer insulating film may not be formed on the via 310.

The dielectric constant of the material contained in the second region 202 of the interlayer insulating film 200 may be different from the dielectric constant of the material contained in the first region 201 of the interlayer insulating film 200.

Figure 14:
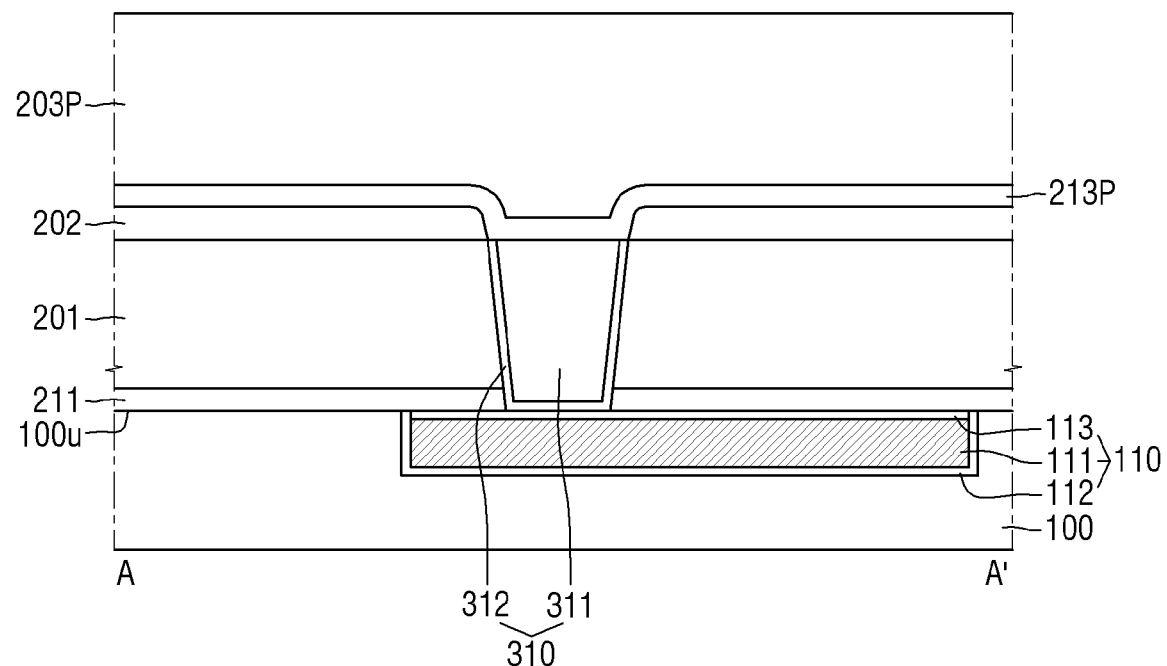

Referring to FIG. 14, the pre-second etch stop film 213P may be formed on the second region 202 of the interlayer insulating film and on the via 310. The pre-second interlayer insulating film 203P may be formed on the pre-second etch stop film 213P.

Figure 15:
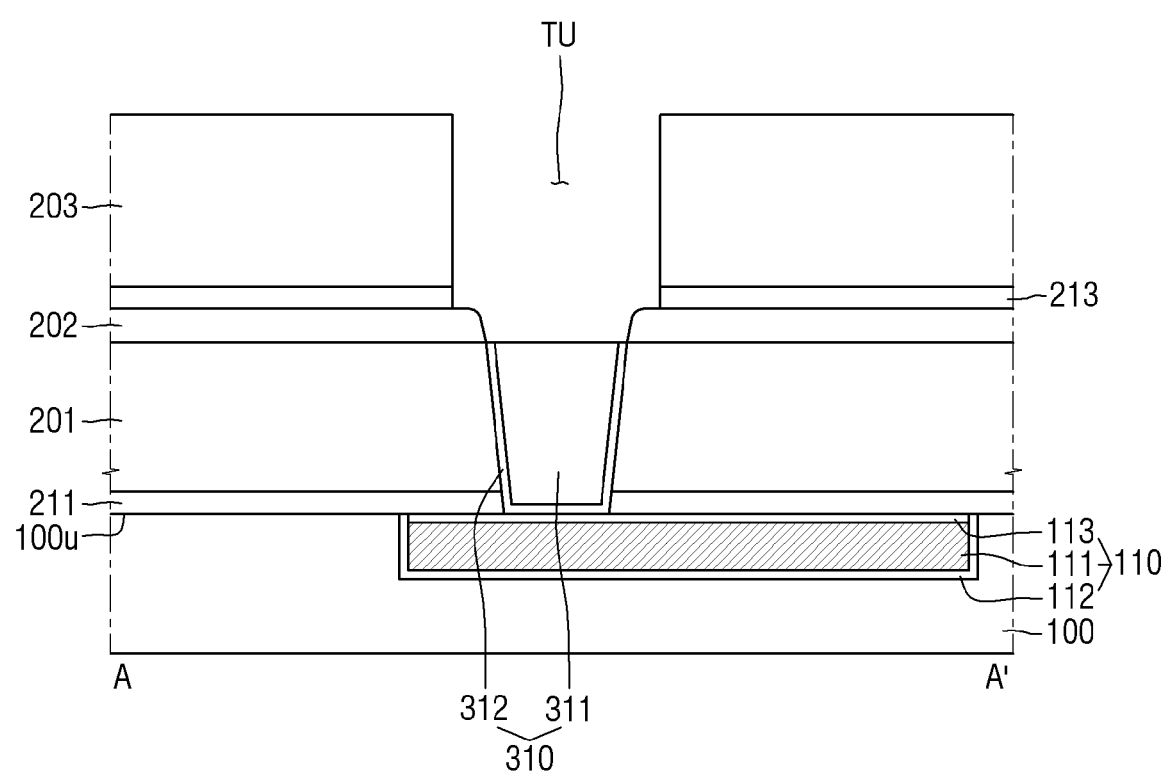

Referring to FIG. 15, the first upper wiring trench TU may be formed to penetrate the pre-second interlayer insulating film 203P and the pre-second etch stop film 213P. Due to formation of the first upper wiring trench TU, the second etch stop film 213 and the third region 203 of the interlayer insulating film may be formed. The first upper wiring trench TU may expose the via 310 and a part of the second region 202 of the interlayer insulating film 200.

The first upper wiring 410 may be formed in the first upper wiring trench TU.

Hereinafter, a method for fabricating the semiconductor device according to some embodiments of the present inventive concept will be described with reference to FIGS. 8, 10 to 12, and 16 to 18. For clarity of explanation, repeated parts of the aforementioned description will not be described.

Figure 16:
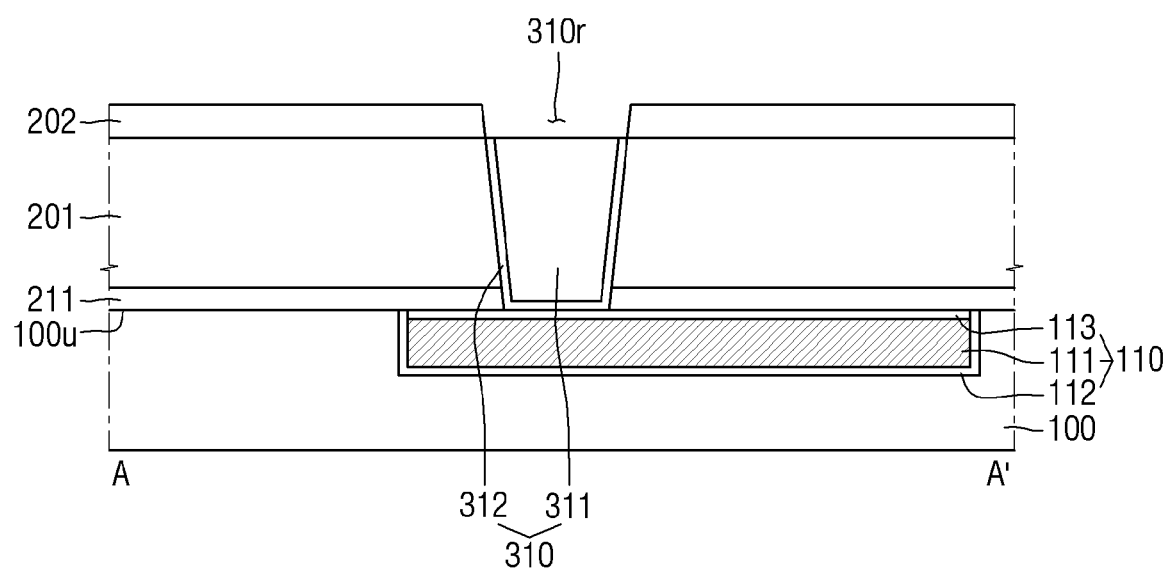
Figure 17:
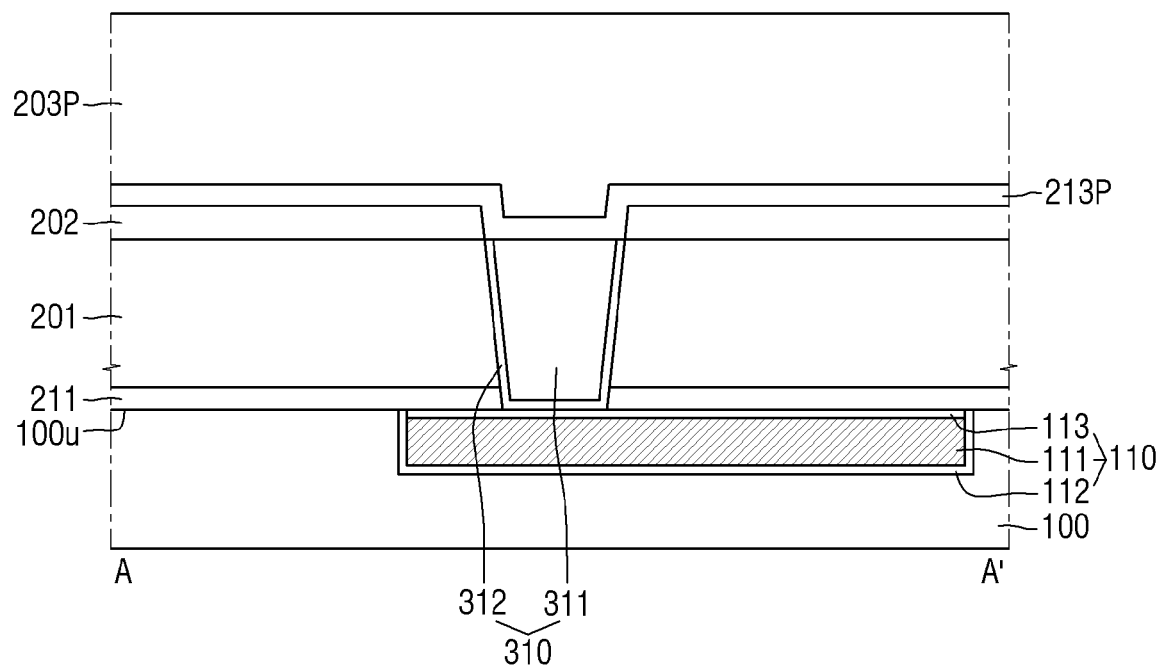
Figure 18:
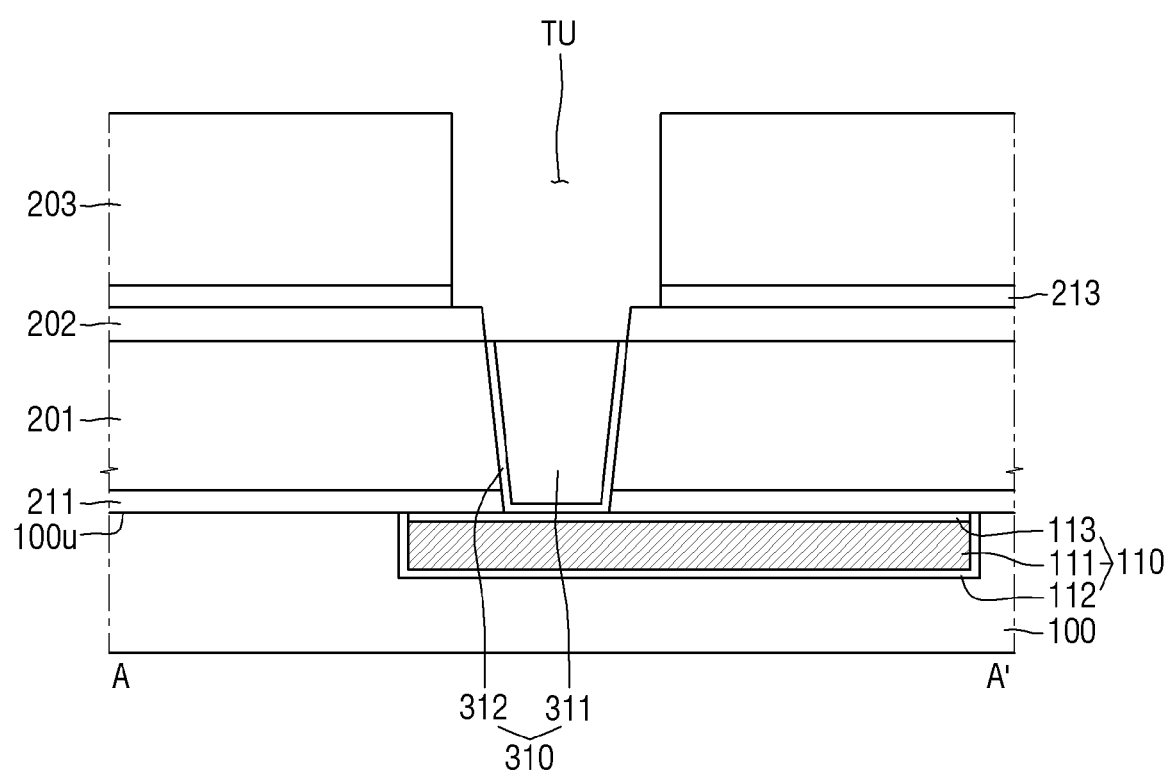

FIGS. 16 to 18 are intermediate step diagrams for explaining a method for manufacturing the semiconductor device according to some embodiments of the present inventive concept.

FIG. 16 is a diagram illustrating a semiconductor device according to some embodiments after the fabricating processes of the semiconductor device of FIGS. 10 to 12 are performed.

Referring to FIG. 16, a via recess 310r may be formed by removing a part of the upper part of the via 310. Any residue remaining on the upper part of the via 310 after forming the via recess 310r may be removed by a cleaning process. Due to formation of the via recess 310r, the upper surface of the pre-first interlayer insulating film 201P may protrude from the upper surface of the via 310. For example, due to formation of the via recess 310r, the first region 201 of the interlayer insulating film, and the second region 202 of the interlayer insulating film protruding from the first region 201 of the interlayer insulating film may be formed. The first region 201 of the interlayer insulating film and the second region 202 of the interlayer insulating film may include the same material compositions having the same dielectric constant.

Referring to FIG. 17, the pre-second etch stop film 213P is formed on the second region 202 of the interlayer insulating film and may be formed to fill at least a part of the via recess 310r on the via 310. The pre-second interlayer insulating film 203P may be formed on the pre-second etch stop film 213P.

Referring to FIG. 18, the first upper wiring trench TU may be formed to pass through the pre-second interlayer insulating film 203P and the pre-second etch stop film 213P. Due to formation of the first upper wiring trench TU, the second etch stop film 213 and the third region 203 of the interlayer insulating film may be formed.

The first upper wiring 410 may be formed in the first upper wiring trench TU.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a substrate including a lower wiring;
a first interlayer insulating film disposed on the substrate and including a first region and a second region over the first region,
wherein the second region has an inner side surface, an upper surface and a rounded corner connecting the upper surface and the inner side surface;
an etch stop film on the first interlayer insulating film, wherein the etch stop film exposes the rounded corner of the first interlayer insulating film;
a second interlayer insulating film on the etch stop film;
a first upper wiring in the second interlayer insulating film, the etch stop film, and the second region of the first interlayer insulating film, the first upper wiring being spaced apart from the lower wiring, wherein the first upper wiring includes a first upper wiring film and a barrier film; and
a via in the first region of the first interlayer insulating film, the via connecting the lower wiring and the first upper wiring,
wherein the barrier film is interposed between the via and the first upper wiring film of the first upper wiring, and
wherein the first upper wiring includes a first portion in the second interlayer insulating film, and a second portion in the etch stop film and the second region of the first interlayer insulating film, and the second portion of the first upper wiring includes a stepped sidewall.

2. The semiconductor device of claim 1,
wherein a first width of the second portion of the first upper wiring, at a boundary between the second region of the first interlayer insulating film and the etch stop film, in the second region of the first interlayer insulating film is smaller than a second width of the second portion of the first upper wiring in the etch stop film.

3. The semiconductor device of claim 1,
wherein the stepped sidewall of the second portion of the first upper wiring in the second region of the first interlayer insulating film includes a first point separated from a reference point of a lower surface of the first upper wiring by a first distance, and a second point separated from the reference point by a second distance smaller than the first distance, and
a width of the second portion of the first upper wiring at the first point is larger than a width of the second portion of the first upper wiring at the second point.

4. The semiconductor device of claim 1,
wherein the first upper wiring includes a short side extending in a first direction, and a long side extending in a second direction intersecting with the first direction and connected to the short side,
wherein a first width of the second portion of the first upper wiring, at a boundary between the second region of the first interlayer insulating film and the etch stop film, in the first direction in the second region of the first upper wiring is smaller than a second width of the second portion of the first upper wiring in the first direction in the etch stop film,
wherein a third width of the second portion of the first upper wiring, at the boundary, in the second direction in the second region of the first interlayer insulating film is smaller than a fourth width of the second portion of the first upper wiring in the second direction in the etch stop film, and
wherein the first direction is a direction parallel to an upper surface of the substrate.

5. The semiconductor device of claim 1, further comprising:
a second upper wiring in the second interlayer insulating film and the etch stop film, the second upper wiring is spaced apart from the first upper wiring, and the second upper wiring disposed on the second region of the first interlayer insulating film, and
wherein a first height from an upper surface of the substrate to a lower surface of the first upper wiring is smaller than a second height from the upper surface of the substrate to a lower surface of the second upper wiring.

6. The semiconductor device of claim 1,
wherein the first upper wiring includes a short side extending in a first direction, and a long side extending in a second direction intersecting with the first direction and connected to the short side,
wherein a width of the second portion of the first upper wiring in the first direction in the second region of the first interlayer insulating film decreases in a direction from an upper surface of the first upper wiring toward a lower surface of the first upper wiring, and
wherein a width of the second portion of the first upper wiring in the second direction in the second region of the first interlayer insulating film decreases in the direction.

7. The semiconductor device of claim 1,
wherein a dielectric constant of a material included in the first region of the first interlayer insulating film is different from a dielectric constant of a material included in the second region of the first interlayer insulating film.

8. The semiconductor device of claim 1,
wherein the first region of the first interlayer insulating film and the second region of the first interlayer insulating film contain the same material composition.

9. The semiconductor device of claim 2,
wherein the first upper wiring includes a short side extending in a first direction,
wherein the first width and the second width are values measured in the first direction, and
wherein the first direction is a direction parallel to an upper surface of the substrate.

10. A semiconductor device comprising:
a substrate including a lower wiring;

a first interlayer insulating film disposed on the substrate and including a first region and a second region over the first region;

an etch stop film on the first interlayer insulating film;

a second interlayer insulating film on the etch stop film;

a via connected to the lower wiring in the first region of the first interlayer insulating film;

a trench in the second interlayer insulating film, the etch stop film, and the second region of the first interlayer insulating film, wherein the trench exposes the via; and a first upper wiring on the via and connected to the via, the first upper wiring filling the trench, wherein a first width of the first upper wiring, at a boundary between the second region of the first interlayer insulating film and the etch stop film, in the second region of the first interlayer insulating film in a first direction parallel to an upper surface of the substrate is smaller than a second width of the first upper wiring in the etch stop film in the first direction, wherein the boundary is parallel to the upper surface of the substrate, wherein a sidewall of the first upper wiring in the second region of the first interlayer insulating film has a first point spaced apart from a reference point of a lower surface of the first upper wiring by a first distance, and a second point spaced from the reference point by a second distance smaller than the first distance, and wherein a width of the first upper wiring at the first point is larger than a width of the first upper wiring at the second point.

11. The semiconductor device of claim 10, wherein the first upper wiring includes a short side extending in the first direction, and the first width and the second width are values measured in the first direction.

12. The semiconductor device of claim 10, wherein the first upper wiring includes a short side extending in the first direction, and a long side extending in a second direction intersecting with the first direction and connected to the short side, wherein the first width and the second width are values measured in the first direction, and wherein a third width in the second direction of the first upper wiring, at the boundary, in the second region of the first interlayer insulating film is smaller than a fourth width of the first upper wiring in the second direction in the etch stop film.

13. The semiconductor device of claim 10, further comprising:

a second upper wiring spaced apart from the first upper wiring in the second interlayer insulating film and the etch stop film, on the second region of the first interlayer insulating film, wherein a first height from the upper surface of the substrate to a lower surface of the first upper wiring is smaller than a second height from the upper surface of the substrate to a lower surface of the second upper wiring.

14. A semiconductor device comprising:

a substrate including a lower wiring extended in a first direction;

an interlayer insulating film disposed on the substrate and including a first region, a second region on the first region, and a third region on the second region;

an opening in the interlayer insulating film, wherein the opening includes a first portion exposing the lower wiring and defined by the first region of the interlayer insulating film, a second portion defined by the second region of the interlayer insulating film, and a third portion defined by the third region of the interlayer insulating film, wherein the third portion of the opening is elongated in a second direction intersecting with the first direction;

a via which fills the first portion of the opening and connected to the lower wiring on the lower wiring; and a first upper wiring on the via, wherein the first upper wiring fills the second portion of the opening and the third portion of the opening, is connected to the via, and includes a short side extending in the first direction parallel to an upper surface of the substrate, wherein a first width of the first upper wiring, at a boundary between the second region of the interlayer insulating film and the third region of the interlayer insulating film, filling the second portion of the opening in the first direction is smaller than a second width of the first upper wiring filling the third portion of the opening in the first direction, and wherein the boundary is parallel to the upper surface of the substrate.

15. The semiconductor device of claim 14, wherein the first upper wiring includes a long side extending in the second direction and connected to the short side, and wherein a third width, at the boundary, in the second direction of the first upper wiring filling the second portion of the opening is smaller than a fourth width in the second direction of the first upper wiring filling the third portion of the opening.

16. The semiconductor device of claim 14, wherein the first upper wiring includes a long side extending in the second direction and connected to the short side, and wherein a width of the first upper wiring filling the second portion of the opening in the second direction decreases in a direction from an upper surface of the first upper wiring toward a lower surface of the first upper wiring.

17. The semiconductor device of claim 14, wherein a sidewall of the first upper wiring filling the second portion of the opening has a first point spaced apart from a reference point of a lower surface of the first upper wiring by a first distance, and a second point spaced apart from the reference point by a second distance smaller than the first distance, and wherein a width of the first upper wiring at the first point is larger than a width of the first upper wiring at the second point.

18. The semiconductor device of claim 14, wherein the third region includes an etch stop film between the second region of the interlayer insulating film and the third region of the interlayer insulating film, wherein the third portion of the opening penetrates the etch stop film.

19. The semiconductor device of claim 14, further comprising:

a second upper wiring spaced apart from the first upper wiring in the third region of the interlayer insulating film, wherein a first height from the upper surface of the substrate to a lower surface of the first upper wiring is smaller than a second height from the upper surface of the substrate to a lower surface of the second upper wiring.

\* \* \* \* \*